US012563991B2

(12) United States Patent
Chandrasekar et al.

(10) Patent No.: US 12,563,991 B2
(45) Date of Patent: *Feb. 24, 2026

(54) THERMAL CHOKE PLATE

(71) Applicant: Applied Materials, Inc., Santa Clara, CA (US)

(72) Inventors: Siva Chandrasekar, Tamil (IN); Satish Radhakrishnan, San Jose, CA (US); Viren Kalsekar, Mountain View, CA (US); Vellaichamy Nagappan, Tamil (IN); Vinay K. Prabhakar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 787 days.

This patent is subject to a terminal disclaimer.

(21) Appl. No.: 17/411,926

(22) Filed: Aug. 25, 2021

(65) Prior Publication Data
US 2023/0069317 A1    Mar. 2, 2023

(51) Int. Cl.
*H01L 21/67* (2006.01)
*H01J 37/32* (2006.01)

(52) U.S. Cl.
CPC .. *H01L 21/67017* (2013.01); *H01J 37/32513* (2013.01); *H01L 21/6719* (2013.01);
(Continued)

(58) Field of Classification Search
None
See application file for complete search history.

(56) References Cited

U.S. PATENT DOCUMENTS 5,223,001 A * 6/1993 Saeki ................ H01L 21/67751
414/217
5,676,757 A * 10/1997 Ikeda ......................... B01J 3/03
118/733
(Continued)

FOREIGN PATENT DOCUMENTS

KR 20090117755 A 11/2009
KR 20180123588 A 11/2018
(Continued)

OTHER PUBLICATIONS

International Search Report and Written Opinion mailed on Nov. 23, 2022 in International Patent Application No. PCT/US2022/040482, 9 pages.
(Continued)

*Primary Examiner* — Jeffrie R Lund
*Assistant Examiner* — Tiffany Z Nuckols
(74) *Attorney, Agent, or Firm* — Kilpatrick Townsend & Stockton LLP

(57) ABSTRACT

Exemplary substrate processing systems may include a chamber body defining a transfer region. The systems may include a lid plate seated on the chamber body. The lid plate may define a first plurality of apertures and a second plurality of apertures. The systems may include a plurality of lid stacks equal to a number of the first plurality of apertures. Each lid stack may include a choke plate seated on the lid plate along a first surface of the choke plate. The choke plate may define a first aperture axially aligned with an associated aperture of the first plurality of apertures. The choke plate may define a second aperture axially aligned with an associated aperture of the second plurality of apertures. The choke plate may define protrusions extending from each of a top and bottom surface of the choke plate that are arranged substantially symmetrically about the first aperture.

20 Claims, 6 Drawing Sheets

(52) U.S. Cl.
CPC .. *H01L 21/67196* (2013.01); *H01J 37/32091*
(2013.01); *H01L 21/67167* (2013.01)

(56) References Cited

U.S. PATENT DOCUMENTS

| | | | | |
|---|---|---|---|---|
| 6,416,634 | B1 * | 7/2002 | Mostovoy | F16J 15/062 |
| | | | | 204/192.12 |
| 10,121,682 | B2 | 11/2018 | Smargiassi et al. | |
| 2003/0097987 | A1 * | 5/2003 | Fukuda | H01J 37/32082 |
| | | | | 156/345.35 |
| 2003/0221780 | A1 | 12/2003 | Lei et al. | |
| 2004/0221808 | A1 * | 11/2004 | Kawano | F16J 15/0887 |
| | | | | 118/715 |
| 2007/0209590 | A1 * | 9/2007 | Li | C23C 16/4401 |
| | | | | 118/733 |
| 2008/0178797 | A1 | 7/2008 | Fodor et al. | |
| 2010/0294199 | A1 | 11/2010 | Tran et al. | |
| 2016/0027672 | A1 * | 1/2016 | Asakawa | H01L 21/68785 |
| | | | | 156/345.37 |
| 2018/0233327 | A1 * | 8/2018 | Kalnin | H01L 21/67017 |
| 2019/0360100 | A1 * | 11/2019 | Nguyen | C23C 16/505 |

| | | | | |
|---|---|---|---|---|
| 2021/0013069 | A1 | 1/2021 | Kalsekar et al. | |
| 2021/0156028 | A1 | 5/2021 | Ruan et al. | |
| 2021/0320018 | A1 * | 10/2021 | Chandrasekar | H01L 21/6719 |
| 2021/0335635 | A1 * | 10/2021 | Kalsekar | H01L 21/67017 |

FOREIGN PATENT DOCUMENTS

| | | |
|---|---|---|
| KR | 20210093762 A | 7/2021 |
| TW | 201246444 A | 11/2012 |
| TW | 201725652 A | 7/2017 |
| TW | 202114041 A | 4/2021 |
| WO | 2018057369 A1 | 3/2018 |

OTHER PUBLICATIONS

Taiwanese Application No. 111131456, Office Action mailed on Apr. 25, 2023, 5 pages (1 page of English Translation and 4 pages of Original Copy).

Korean Application No. 10-2024-7009333, Notice of Decision to Grant mailed on Aug. 27, 2025, 3 pages (1 page of English Translation and 2 pages of Original Copy).

* cited by examiner

THERMAL CHOKE PLATE

TECHNICAL FIELD

The present technology relates to semiconductor processing equipment. More specifically, the present technology relates to semiconductor chamber components to provide controlled heat distribution.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Processing systems may use one or more components to distribute precursors or fluids into a processing region, which may improve uniformity of distribution. One or more of these components may be heated during processing operations. The heat may extend through components of the lid stack. Depending on the coupling of components within the system, the heat transfer may not be uniform between components.

Thus, there is a need for improved systems and components that can be used to produce high quality semiconductor devices. These and other needs are addressed by the present technology.

SUMMARY

Exemplary substrate processing systems may include a chamber body defining a transfer region. The systems may include a lid plate seated on the chamber body. The lid plate may define a first plurality of apertures through the lid plate and a second plurality of apertures through the lid plate. The systems may include a plurality of lid stacks equal to a number of apertures of the first plurality of apertures defined through the lid plate. The plurality of lid stacks may at least partially define a plurality of processing regions vertically offset from the transfer region. Each lid stack of the plurality of lid stacks may include a choke plate seated on the lid plate along a first surface of the choke plate. The choke plate may define a first aperture axially aligned with an associated aperture of the first plurality of apertures. The choke plate may define a second aperture axially aligned with an associated aperture of the second plurality of apertures. The choke plate may define a first set of protrusions extending from a first surface of the choke plate. The first set of protrusions may be arranged substantially symmetrically about the first aperture. The choke plate may define a second set of protrusions extending from a second surface of the choke plate. The second set of protrusions may be arranged substantially symmetrically about the first aperture. The lid stacks may include a pumping liner seated on the second set of protrusions of the choke plate. The lid stacks may include a faceplate seated on the pumping liner.

In some embodiments, the choke plate may include a rim defining the first aperture. The rim may extend along a sidewall of the lid plate defining the associated aperture of the first plurality of apertures. The associated aperture of the second plurality of apertures defined through the lid plate and the second aperture defined through the choke plate may form a flow channel extending from the pumping liner. The choke plate may define a first channel in the second surface of the choke plate radially inward of the second set of protrusions. The choke plate may define a second channel in the second surface of the choke plate radially outward of the second set of protrusions. The system may include a blocker plate seated on the faceplate. The system may include a faceplate heater seated on the faceplate and positioned radially outward of the blocker plate. The system may include a gasbox seated on the blocker plate. The second aperture defined through the choke plate may be laterally offset from the first aperture defined through the choke plate. Each protrusion of the second set of protrusions may be vertically aligned with a protrusion of the first set of protrusions. The first surface of the choke plate may define a step that is disposed radially outward from the first set of protrusions. The step may be recessed relative to the first surface by a distance of between about 0.05 mm and 0.50 mm. An outer periphery of the choke plate may be generally tear drop-shaped. Each protrusion of the first set of protrusions and the second set of protrusions may have a width of between about 1 mm and 10 mm.

Some embodiments of the present technology may encompass substrate processing chamber choke plates. The choke plates may be or include a plate defining a first aperture through the plate and a second aperture through the plate. The second aperture may be laterally offset from the first aperture. The plate may define a first set of protrusions extending from a first surface of the plate. The first set of protrusions may be arranged substantially symmetrically about the first aperture. The plate may define a second set of protrusions extending from a second surface of the plate opposite the first surface of the plate. The second set of protrusions may be arranged substantially symmetrically about the first aperture.

In some embodiments, the plate may include a rim defining the first aperture. The rim may extend vertically from the first surface of the plate. The first set of protrusions may be disposed at regular intervals about the first aperture. The second set of protrusions may be disposed at regular intervals about the first aperture. Each protrusion of the first set of protrusions and the second set of protrusions may have a length of between about 5 mm and 50 mm. The plate may define a third set of protrusions extending from the first surface of the plate. The third set of protrusions may be arranged substantially symmetrically about the second aperture. The plate may define a fourth set of protrusions extending from the second surface of the plate. The fourth set of protrusions may be arranged substantially symmetrically about the second aperture.

Some embodiments of the present technology may encompass substrate processing systems. The systems may include a processing chamber defining a processing region. The systems may include a pedestal configured to support a substrate within the processing region. The systems may include a choke plate defining a first aperture and a second aperture through the choke plate. The choke plate may define a set of protrusions extending from a surface of the choke plate. The first set of protrusions may be arranged substantially symmetrically about the first aperture. The choke plate may define a second set of protrusions extending from a second surface of the choke plate opposite the first surface of the choke plate. The second set of protrusions may be arranged substantially symmetrically about the first aperture. The systems may include a pumping liner seated on the choke plate. The systems may include a faceplate seated on the pumping liner. The systems may include a blocker plate seated on the faceplate. In some embodiments, the first set of protrusions may be vertically aligned with the second set of protrusions.

Such technology may provide numerous benefits over conventional systems and techniques. For example, improved control over heat transfer may improve symmetry of heat distribution radially along the faceplate. Additionally, reduced contact locations between components may control heat losses from heated components. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
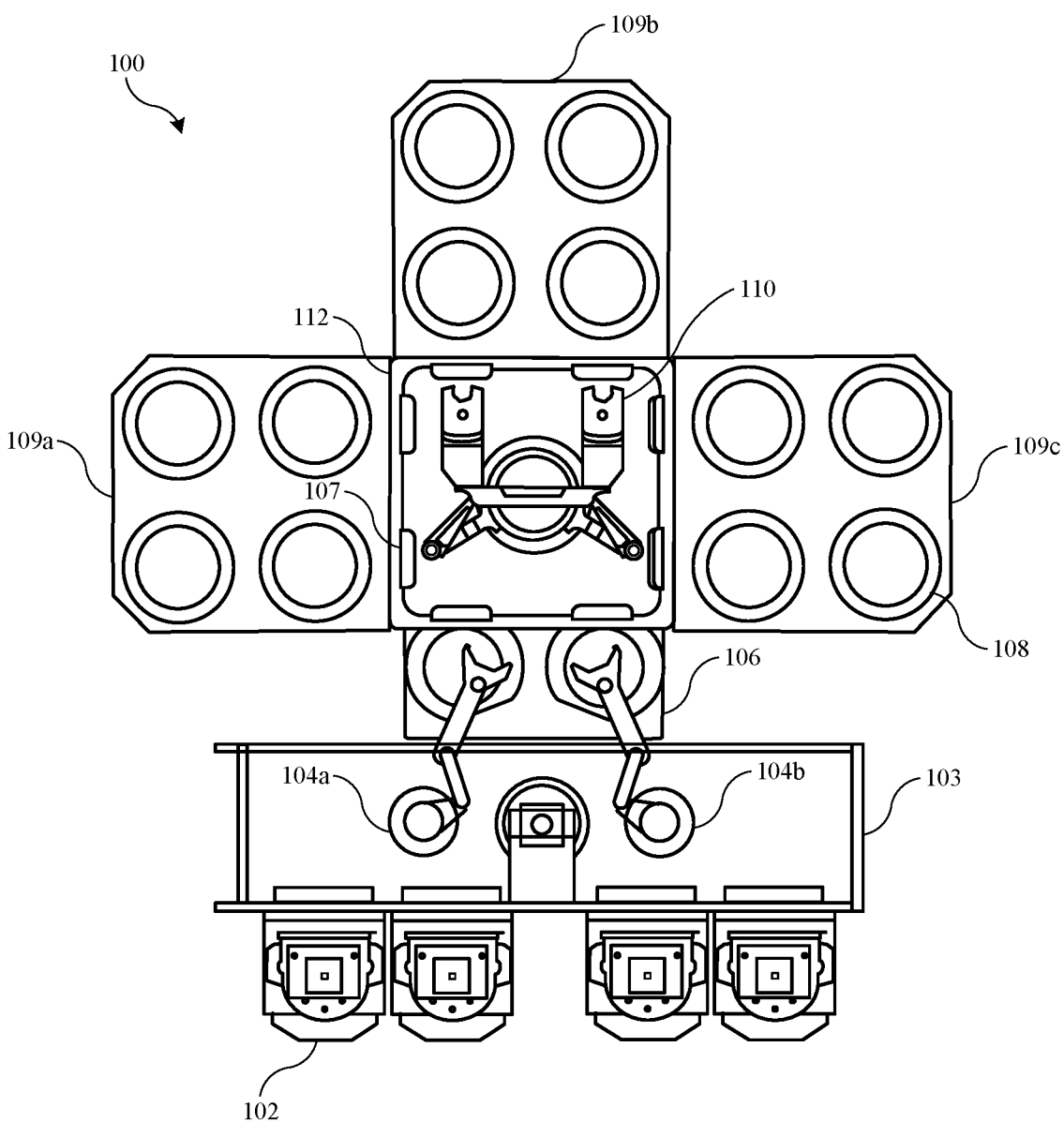
FIG. 1A shows a schematic top view of an exemplary processing tool according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

As additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. A substrate support may then vertically translate between the transfer region and the processing region to deliver a substrate for processing.

Each individual processing location may include a separate lid stack to provide improved and more uniform delivery of processing precursors into the separate processing regions. The arrangement of the system may affect heat transfer from the system, and make uniform heat transfer more difficult. For example, cooling systems that accommodate multi-chamber systems may cause asymmetric cooling from the system. While a component may be relatively uniformly heated, such as a faceplate, heat distribution from the component may not be uniform, which may cause temperature skews on the component. In the example of a faceplate of each of multiple lid stacks, the heat distribution may occur more readily in some regions than in others. For example, regions of the faceplate near a pumping assembly that exhausts process gases from the chamber may experience higher temperatures than the rest of the faceplate, which may cause planar film non-uniformity issues on wafer. These planar non-uniformity issues may not be correctable using process parameters, such as by tuning a heater. The present technology may incorporate components configured to thermally isolate the pumping assembly and faceplate from the lid (which is colder) to prevent heat losses, and may facilitate symmetric heat distribution through the system, which may improve symmetry of temperature patterns across components. Additionally, the present technology may reduce heat losses by reducing contact between components of the lid stack, which may reduce power consumption of a heater used to maintain component temperatures.

Although the remaining disclosure will routinely identify specific structures, such as four-position transfer regions, for which the present structures and methods may be employed, it will be readily understood that the faceplates or components discussed may be equally employed in any number of other systems or chambers, as well as any other apparatus in which multiple components may be joined or coupled. Accordingly, the technology should not be considered to be so limited as for use with any particular chambers alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104*a* and 104*b* and placed into a load lock or low pressure holding area 106 before being delivered to one of the substrate processing regions 108, positioned in chamber systems or quad sections 109*a-c*, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109*a* and 109*b*, may be used to deposit material on the substrate, and the third set of processing chambers, such as the processing chambers or regions in quad section 109*c*, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
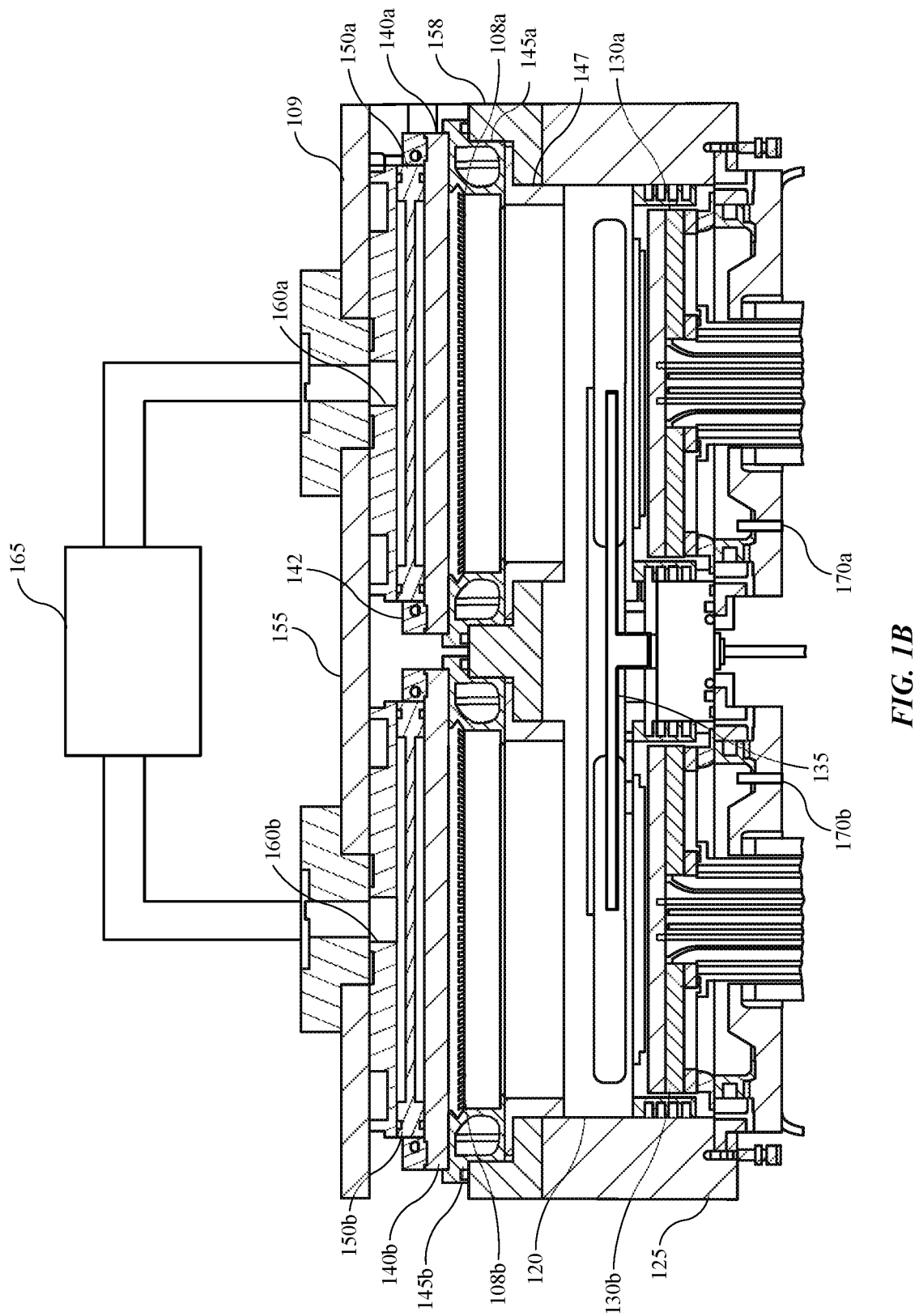
FIG. 1B shows a schematic partial cross-sectional view of an exemplary processing system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130a may deliver a substrate into processing region 108a, while substrate support 130b may deliver a substrate into processing region 108b. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. The faceplate may be heated in some embodiments with a heater 142 extending about the faceplate. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. The pumping liners 145 may be seated on a thermal choke plate 147, which may control heat distribution from the lid stack to the cooled chamber body. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. Lid 155 may be one of two separate lid plates of the system in some embodiments. For example, a first lid plate 158 may be seated over transfer region housing 125. The transfer region housing may define an open volume, and first lid plate 158 may include a number of apertures through the lid plate separating the overlying volume into specific processing regions. In some embodiments, such as illustrated, lid 155 may be a second lid plate, and may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

In some embodiments a purge channel 170 may extend through the transfer region housing proximate or near each substrate support 130. For example, a plurality of purge channels may extend through the transfer region housing to provide fluid access for a fluidly coupled purge gas to be delivered into the transfer region. The number of purge channels may be the same or different, including more or less, than the number of substrate supports within the processing system. For example, a purge channel 170 may extend through the transfer region housing beneath each substrate support. With the two substrate supports 130 illustrated, a first purge channel 170a may extend through the housing proximate substrate support 130a, and a second purge channel 170b may extend through the housing proximate substrate support 130b. It is to be understood that any additional substrate supports may similarly have a plumbed purge channel extending through the transfer region housing to provide a purge gas into the transfer region.

When purge gas is delivered through one or more of the purge channels, it may be similarly exhausted through pumping liners 145, which may provide all exhaust paths from the processing system. Consequently, in some embodiments both the processing precursors and the purge gases may be exhausted through the pumping liners. The purge gases may flow upwards to an associated pumping liner, for example purge gas flowed through purge channel 170b may be exhausted from the processing system from pumping liner 145b.

Figure 2:
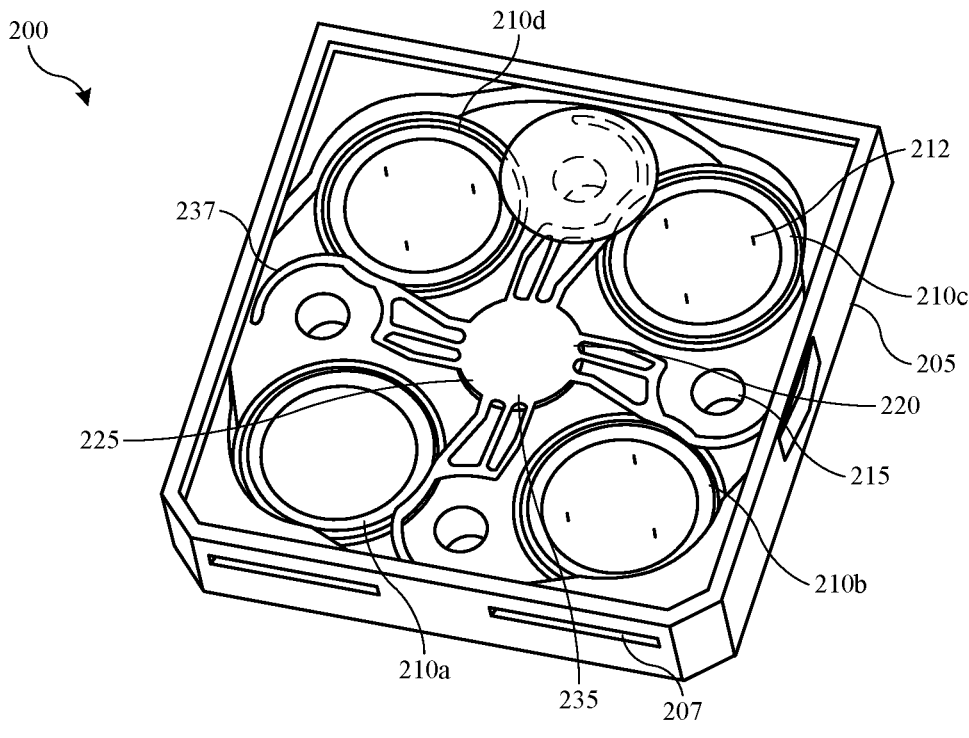
FIG. 2 shows a schematic isometric view of a transfer section of an exemplary substrate processing system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub.

Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology.

Figure 3:
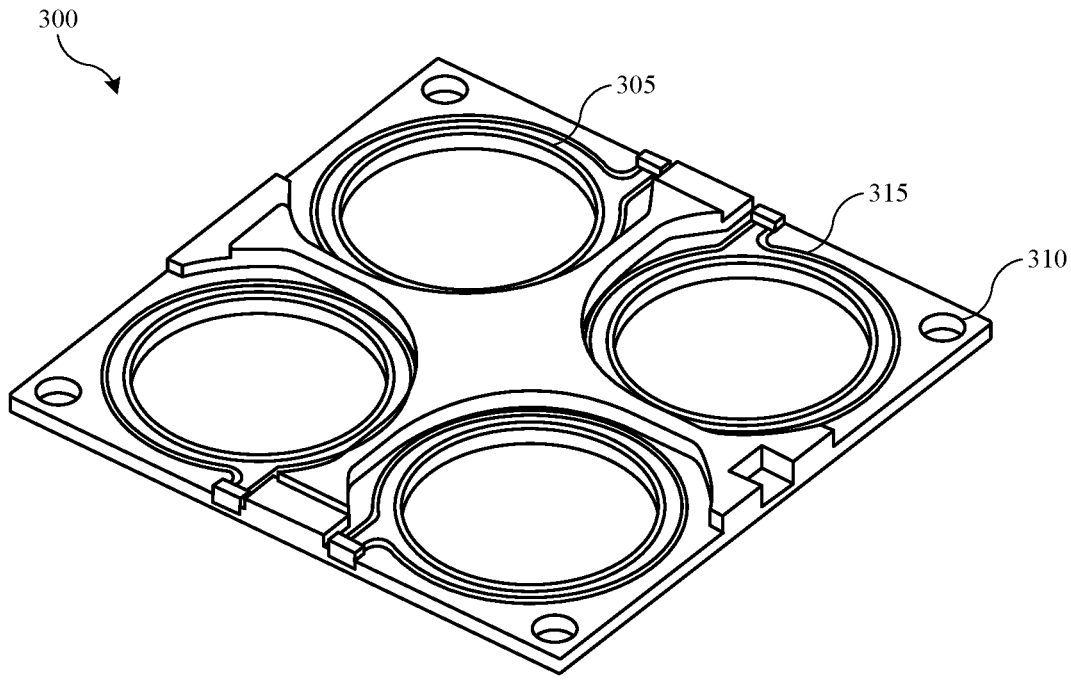
FIG. 3 shows a schematic isometric view of a lid plate of an exemplary substrate processing system according to some embodiments of the present technology.

As discussed previously, overlying the transfer region housing 205 may be a lid plate, such as a first lid plate that may define separate processing regions accessible to the substrate supports. FIG. 3 shows a schematic isometric view of a lid plate 300 of an exemplary substrate processing system according to some embodiments of the present technology. Lid plate 300 may include any feature of first lid plate 158 or any other component as previously described. As illustrated, lid plate 300 may define a first plurality of apertures 305, which may define the individual processing regions as previously described. The lid plate 300 may also define a second plurality of apertures 310. Each aperture 310 may be positioned adjacent an associated aperture 305. While apertures 305 may define processing regions, apertures 310 may define exhaust access, or access routes to a system foreline, by which each processing region may be exhausted. As will be described further below, the pumping liner for each individual lid stack may be oriented to exhaust through an associated aperture 310. Although four apertures 305 and four apertures 310 are illustrated, it is to be understood that lid plates according to embodiments of the present technology may include any number of apertures for any configuration of a processing chamber or exhaust system.

In some embodiments of the present technology a cooling system may be incorporated within the lid plate. As illustrated, a fluid cooling line 315 may be extended about each first aperture 305. This may allow cooling of the chamber body during processing. Because of the system set ups, each chamber region may exhaust to a foreline connection at a distal edge of the lid plate 300 as illustrated, although other configurations may similarly be encompassed by the present technology. Heated process gases or effluents may flow through the lid stack components and out the second apertures, which may increase a temperature of the lid plate in these regions. Consequently, a temperature profile may be developed across the lid plate, where cooler temperatures may occur near a middle of the lid plate. This may affect heat distribution from each individual lid stack as will be discussed further below. Additionally, because components of the lid stack may be coupled non-uniformly, heat loss from the components may not be uniform.

Figure 4:
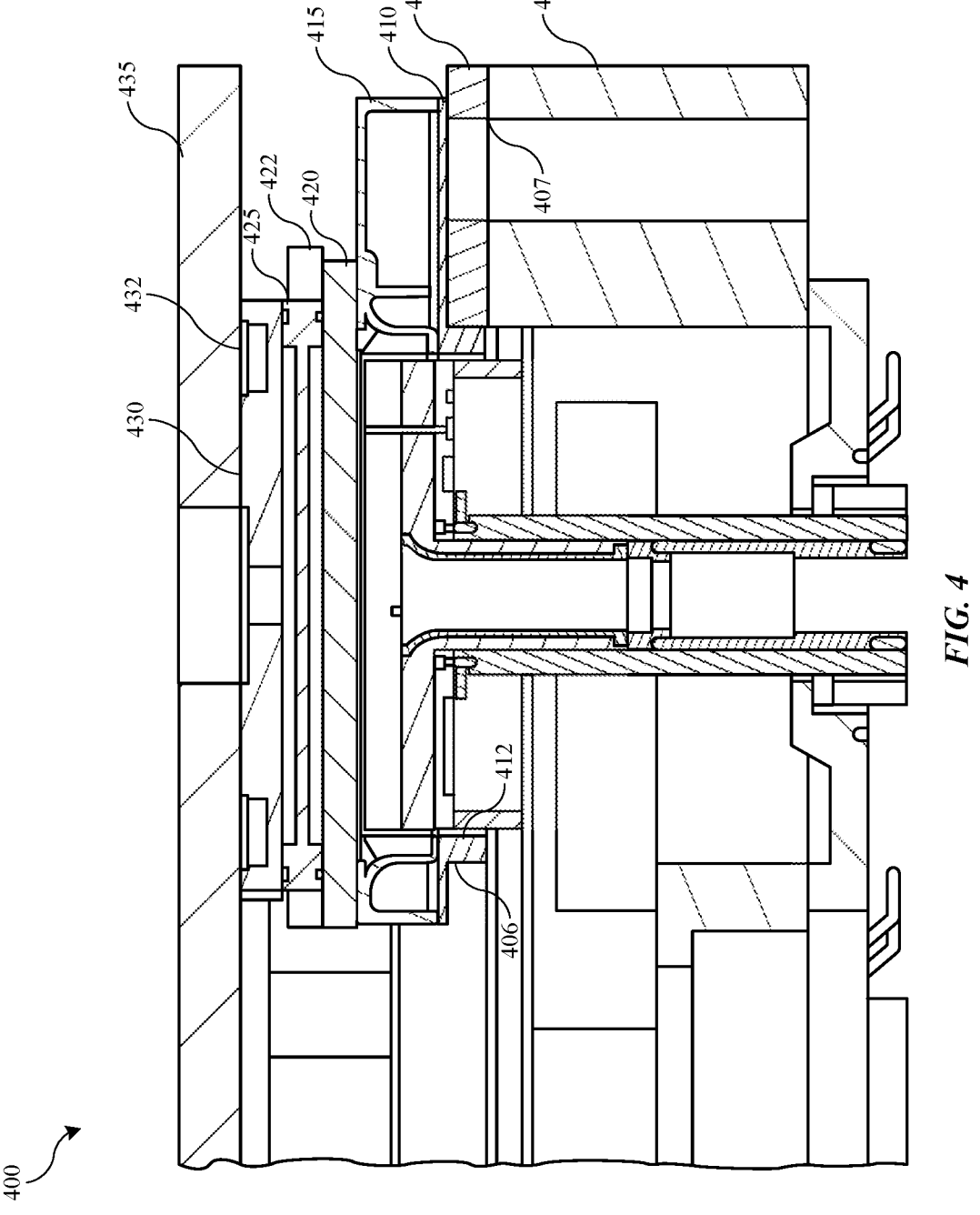
FIG. 4 shows a partial schematic cross-sectional view of an exemplary system arrangement of an exemplary substrate processing system according to some embodiments of the present technology.

FIG. 4 shows a schematic partial cross-sectional view of an exemplary processing system 400 arrangement of an exemplary substrate processing system according to some embodiments of the present technology, and may show a cross-sectional view through a first aperture and a second aperture of the lid plate as discussed above. The figure may illustrate aspects of the processing systems and components described above, and may illustrate additional aspects of the system. The figure may illustrate an additional view or version of the system. It is to be understood that processing system 400 may include any aspect of any portion of the processing systems described or illustrated elsewhere, and may illustrate aspects of a lid stack incorporated with any of the systems described elsewhere. For example, processing system 400 may illustrate a portion of a system overlying the transfer region of a chamber, and may show components positioned over a chamber body defining a transfer region as previously described. It is to be understood that any previously noted components may still be incorporated, such as including a transfer region and any component described previously for a system including the components of processing system 400.

As noted previously, multi-chamber systems may include individual lid stacks for each processing region. Processing system 400 may illustrate a view of one lid stack that may be part of a multi-chamber system including two, three, four, five, six, or more processing chamber sections. It is to be understood, however, that the described lid stack components may also be incorporated in standalone chambers as well. As described above, one or more lid plates may contain the individual lid stacks for each processing region. For example, as illustrated, processing system 400 may include a first lid plate 405, which may be or include any aspect of lid plate 158 described above. For example, first lid plate 405 may be a single lid plate that may be seated on the transfer region housing 402, or chamber body as previously described. The first lid plate 405 may be seated on the housing along a first surface of the lid plate. Lid plate 405 may define a first plurality of apertures 406 through the lid plate allowing the vertical translation of substrates into the defined processing regions as previously described. Apertures 406 may define processing regions where substrate processing may be performed. Lid plate 405 may additionally define a second plurality of apertures 407 through the lid plate allowing exhaust to a foreline and pumping system associated with the processing system.

Seated on the first lid plate 405 may be a plurality of lid stacks as previously described. In some embodiments, the first lid plate 405 may define a recessed ledge as previously illustrated extending from a second surface of the first lid plate 405 opposite the first surface. The recessed ledge may extend about each aperture 406 of the first plurality of apertures, or may extend about a portion of the aperture as illustrated above. Each individual lid stack may be seated on a separate recessed ledge, or may be seated over non-recessed apertures. The plurality of lid stacks may include a number of lid stacks equal to a number of apertures of the plurality of apertures defined through the first lid plate. The lid stacks may at least partially define a plurality of processing regions vertically offset from the transfer region as described above. Although one aperture 406 and one lid stack are illustrated and will be discussed further below, it is to be understood that the processing system 400 may include any number of lid stacks having similar or previously discussed components incorporated with the system in embodiments encompassed by the present technology. The following description may apply to any number of lid stacks or system components.

The lid stacks may include any number of components in embodiments, and may include any of the components described above. For example, the lid stacks may include a choke plate 410 seated on the second surface of the lid plate 405. The choke plate 410 may be seated on the lid plate on a first surface of the choke plate 410. The choke plate may define a first aperture axially aligned with the associated aperture 406 of the first plurality of apertures through the lid plate. The choke plate may also define a second aperture axially aligned with the associated aperture 407 of the second plurality of apertures through the lid plate. As illustrated, choke plate 410 may include a rim 412 defining the first aperture through the choke plate. The rim 412 may extend along a sidewall of the lid plate defining the associated first aperture 406 of the first plurality of apertures. As will be explained below, in some embodiments a gap may be maintained between the rim and the lid plate to control heat flow between the components. Rim 412 may extend vertically from the first surface of the choke plate in a direction towards the lid plate 405, and may form a protrusion from the choke plate 410.

A pumping liner 415 may be seated on a second surface of the choke plate 410 opposite the first surface of the choke plate seated on the lid plate 405. As noted above, pumping liner 415 may be arranged to provide an exhaust to the processing volume, which may flow to the associated second aperture 407. Accordingly, aperture 407 of the second plurality of apertures defined through the lid plate, and the second aperture defined through the choke plate 410 may form a flow channel extending from the pumping liner for the specific processing region defined by the particular lid stack, and which may fluidly couple the processing region with a pumping system or exhaust system. The lid stack may include a faceplate 420 seated on the pumping liner 415. In some embodiments, faceplate 420 may be a heated component, which may include a heater 422, which may be an annular heater in some embodiments, extending about the faceplate.

A blocker plate 425 may be seated on the faceplate 420, and may further facilitate uniform distribution of precursors as described above. In some embodiments, faceplate heater 422 may extend about an outer edge of blocker plate 425, such as radially outward of the blocker plate, and may extend radially about the blocker plate 425. A gap may be maintained between the blocker plate and the heater 422 to limit heating of the blocker plate. A gasbox 430 may be seated on the blocker plate 425. Gasbox 430 may define a channel 432 in which a cooling fluid may be flowed to control a temperature of the components. A second lid plate 435 may be seated on the gasbox 430.

Accordingly, cooling may be provided both above the faceplate with the gasbox, and below the faceplate with the lid plate. While cooling from the gasbox may be maintained relatively uniform based on coupling with the stacked arrangement with the blocker plate, which may provide axi-symmetric cooling from above, cooling to the lid plate may be more difficult to maintain based on the asymmetric coupling of the underlying components. For example, pumping liner 415 may have direct heating from the faceplate seated on the liner, and thus pumping liner 415 may be heated relatively uniformly from the faceplate. However, heat distribution from the pumping liner may not be uniform. As shown in the illustration, choke plate 410 may provide coupling between the pumping liner and lid plate 405, which may include cooling. Although a temperature gradient may be formed across the lid plate with a higher temperature about the second aperture 407, the choke plate 410 and pumping liner 415 may have increased direct coupling with the lid plate at this location, facilitating heat transfer from the pumping liner.

Figure 5:
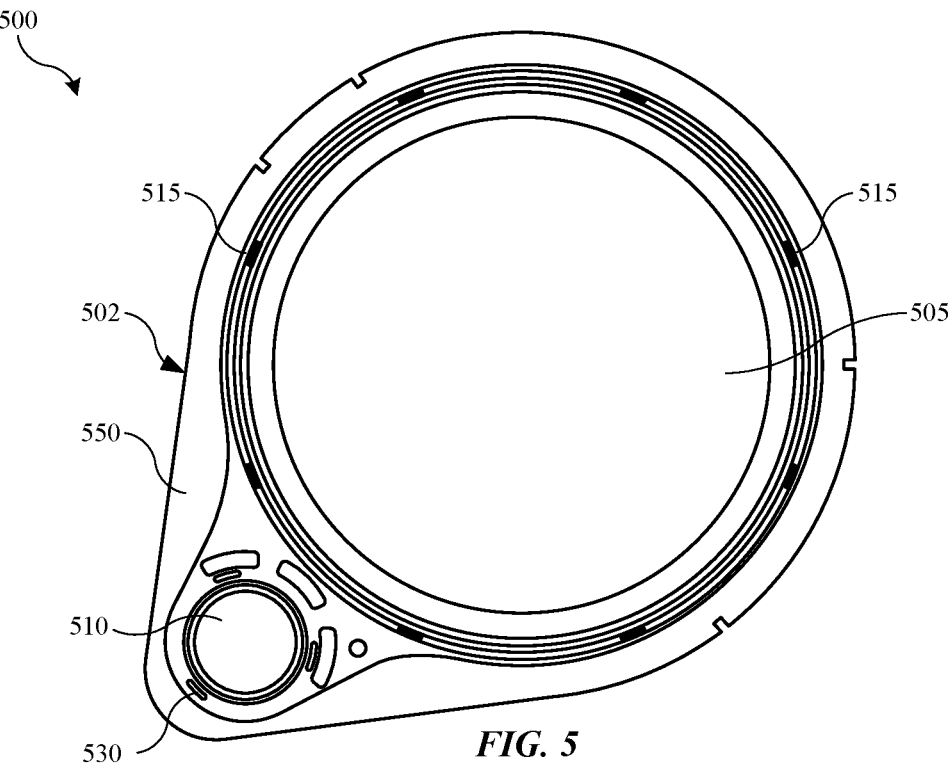
FIG. 5 shows a schematic bottom view of a choke plate of an exemplary substrate processing system according to some embodiments of the present technology.

FIG. 5 shows a schematic bottom view of a choke plate 500 of an exemplary substrate processing system according to some embodiments of the present technology. Although noted as a bottom view, the choke plate may be reversed in some embodiments, and thus the figure may illustrate a first surface 502 of the choke plate 500. Choke plate 500 may illustrate additional features of any choke plate previously described, and may include any feature or characteristic as discussed above. As illustrated, choke plate 500 may be or include a thermally conductive plate defining a first aperture 505 through the plate, and a second aperture 510 through the plate. The second aperture 510 may be laterally offset on the choke plate 500 from the first aperture 505. The geometry of the choke plate 500 may be provided to accommodate the structure of the lid plate on which the choke plate 500 may be seated. In a particular embodiment, an outer periphery of the choke plate 500 may be generally tear drop-shaped. For example, the outer periphery may include a small arc-shaped segment that is joined with a larger arc-shaped segment via two generally linear segments. The second aperture 510 may be coaxial with the small arc-shaped segment, while the first aperture 505 may be coaxial with the larger arc-shaped segment.

The choke plate 500 may define a first set of protrusions 515 extending from a first surface 502 of the choke plate 500. The choke plate 500 may be seated on the lid plate on protrusions 515 in some embodiments. The first set of protrusions 515 may be distributed radially about the first aperture 505 as illustrated. For example, the protrusions 515 may be distributed in a generally symmetric arrangement about the first aperture 505. The protrusions 515 may be spaced apart at regular (or substantially regular) intervals about the first aperture 505. As used herein, substantially regular intervals may be understood to mean that an angular spacing between any two adjacent protrusions may be within or about 10 degrees of an average angular spacing between adjacent protrusions of the choke plate 500, within or about 5 degrees of the average angular spacing, within or about 4 degrees of the average angular spacing, within or about 3 degrees of the average angular spacing, within or about 2 degrees of the average angular spacing, within or about 1 degree of the average angular spacing, or less.

Although eight protrusions 515 are illustrated, it is to be understood that any number of protrusions 515 may be included in embodiments of the present technology. For example, the choke plate 500 may include at least or about four protrusions 515, at least or about five protrusions 515, at least or about six protrusions 515, at least or about seven protrusions 515, at least or about eight protrusions 515, at least or about nine protrusions 515, at least or about 10 protrusions 515, at least or about 12 protrusions 515, at least or about 14 protrusions 515, or more. Each protrusion 515 may project outward from the first surface 502 of the choke plate 500 by between or about 0.05 mm and 0.50 mm, between or about 0.10 mm and 0.40 mm, between or about 0.15 mm and 0.30 mm, or about 0.20 mm. Protrusions 515 may be arcuate segments, however a length of each protrusion 515 may be sufficiently small that each protrusion 515 may be nearly rectangular in shape. Each protrusion 515 may have a length or average length (e.g., average of a length of an inner edge and an outer edge of each protrusion 515) of between or about 5 mm and 50 mm, between or about 10 mm and 40 mm, between or about 15 mm and 30 mm, or about 20 mm. A width (e.g., a distance between an inner edge and an outer edge of each protrusion 515) of each protrusion 515 may be between or about 1 mm and 10 mm, between or about 2 mm and 9 mm, between or about 3 mm and 8 mm, or between or about 4 mm and 7 mm. Typically, each of the protrusions 515 has a same set of dimensions, although some embodiments may incorporate one or more protrusions 515 with different dimensions.

Choke plate 500 may define a number of protrusions 530 that extend from the first surface 502 of the choke plate 500, with the protrusions 530 being distributed radially about the second aperture 510 as illustrated. For example, the protrusions 530 may be distributed in a generally symmetric arrangement about the second aperture 510. The protrusions 530 may be spaced apart at regular (or substantially regular) intervals about the second aperture 510. Although three protrusions 530 are illustrated, it is to be understood that any number of protrusions 530 may be included in embodiments of the present technology. For example, the choke plate 500 may include at least or about three protrusions 530, at least or about four protrusions 530, at least or about five protrusions 530, or more. Each protrusion 530 may project outward from the first surface 502 of the choke plate 500 by between or about 0.05 mm and 0.50 mm, between or about 0.10 mm and 0.40 mm, between or about 0.15 mm and 0.30 mm, or about 0.20 mm. Oftentimes, protrusions 530 may project outward from the first surface 502 by a same or substantially same (e.g., within or about 10%, within or about 5%, within or about 3%, within or about 1%) distance as protrusions 515. Protrusions 530 may be arcuate segments, however a length of each protrusion 530 may be sufficiently small that each protrusion 530 may be nearly rectangular in shape. Each protrusion 530 may have a length or average length (e.g., average of a length of an inner edge and an outer edge of each protrusion 530) of between or about 5 mm and 30 mm, between or about 10 mm and 20 mm, or about 15 mm. A width (e.g., a distance between an inner edge and an outer edge of each protrusion 530) of each protrusion 530 may be between or about 1 mm and 8 mm, between or about 1.5 mm and 6 mm, or between or about 2 mm and 4 mm. Typically, each of the protrusions 530 has a same set of dimensions, although some embodiments may incorporate one or more protrusions 530 with different dimensions.

The first surface 502 of choke plate 500 may define a step 550 that extends about an outer periphery of the first surface 502. For example, the step 550 may be disposed radially outward of the first set of protrusions 515 and/or the protrusions 530. In some embodiments, a shape of the step 550 may substantially match a shape of the outer periphery of the choke plate 500. For example, the step 550 may have a generally tear drop-shape such that a distance from an inner edge of the step may be substantially constant about the choke plate 500. In other embodiments, such as illustrated in FIG. 5, the step 550 may have a generally light bulb-shape. For example, the step 550 may have a large bulbous portion, with outward curving segments and/or linear segments coupling the large bulbous portion with a smaller arcuate portion. In such embodiments, an inner edge of a transition region of the step 550 between the first aperture 505 and second aperture 510 may be positioned at a different distance from the outer periphery of the choke plate 500 and/or an outer edge of the first set of protrusions 515 and/or protrusions 530 than the rest of the inner edge of the step 550. It will be appreciated that any design of step 550 may be used in various embodiments. The step 550 may be recessed relative to the first surface 502 by a distance of between or about 0.05 mm and 0.50 mm, between or about 0.10 mm and 0.40 mm, between or about 0.15 mm and 0.35 mm, between or about 0.20 mm and 0.30 mm, or about 0.25 mm.

Figure 6:
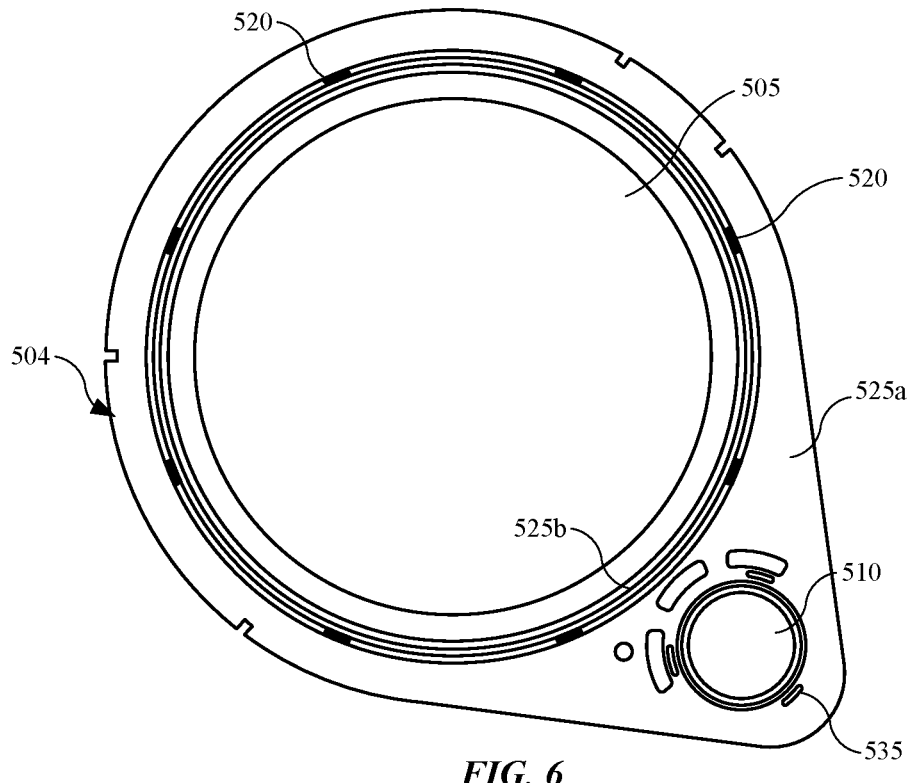
FIG. 6 shows a schematic top view of a choke plate of an exemplary substrate processing system according to some embodiments of the present technology.

FIG. 6 shows a schematic top view of choke plate 500 of an exemplary substrate processing system according to some embodiments of the present technology. Again, although noted as a top view, the choke plate 500 may be reversed in some embodiments, and thus the figure may illustrate a second surface 504 of the choke plate 500 opposite the first surface 502. As illustrated, choke plate 500 may define first aperture 505 and second aperture 510 through the plate. The second surface 504 of choke plate 500 may also define a number of protrusions on which the pumping liner may be seated. For example, choke plate 500 may define a second set of protrusions 520 extending from the second surface 504 of the choke plate 500. Similar to the first set of protrusions 515, the second set of protrusions 520 may be distributed radially about the first aperture 505 as illustrated. For example, the protrusions 520 may be distributed in a generally symmetric arrangement about the first aperture 505. The protrusions 520 may be spaced apart at regular (or substantially regular) intervals about the first aperture 505. In some embodiments, the first set of protrusions 515 may be vertically aligned with the second set of protrusions 520 such that each individual protrusion 520 of the second plurality of protrusions 520 is vertically aligned with a corresponding protrusion 515 of the first set of protrusions 515. In other embodiments, some or all of the second set of protrusions 520 may be vertically offset from the first set of protrusions 515. Each of the protrusions 520 may have a similar size as protrusions 515. For example, in some embodiments the protrusions 520 and protrusions 515 may have identical dimensions, while in other embodiments the protrusions 520 may have different dimensions than protrusions 515. As just one example, the protrusions 520 may have lesser or greater heights (projection distances) than the protrusions 515.

Second surface 504 may also define a number of protrusions 535 that may extend from the second surface 504 of the choke plate 500. Similar to protrusions 530, the protrusions 535 may be distributed radially about the second aperture 510 as illustrated. For example, the protrusions 535 may be distributed in a generally symmetric arrangement about the second aperture 510. The protrusions 535 may be spaced apart at regular (or substantially regular) intervals about the second aperture 510. In some embodiments, the protrusions 530 may be vertically aligned with the protrusions 535 such that each individual protrusion 530 is vertically aligned with a corresponding protrusion 535. In other embodiments, some or all of the protrusions 530 may be vertically offset from the protrusions 535. Each of the protrusions 535 may have a similar size as protrusions 530. For example, in some embodiments the protrusions 530 and protrusions 535 may have identical dimensions, while in other embodiments the protrusions 530 may have different dimensions than protrusions 535. As just one example, the protrusions 530 may have lesser or greater heights (projection distances) than the protrusions 535.

By incorporating a symmetrical arrangements of the various protrusions about the first aperture 505 and second aperture 510, embodiments of the present technology may enable deformation of the choke plate 500 to be more uniform when under high vacuum loads. This even deformation may ensure that heat transfer through the choke plate 500 is uniform, and may help improve the temperature uniformity of the faceplate. Additionally, by keeping the protrusions small in size contact between the choke plate 500 and the pumping liner and lid plate is minimized, which limits heat transfer through the choke plate 500 and helps thermally isolate the pumping liner and faceplate from the colder, unheated lid plate. Moreover, by including step 550, contact between the choke plate 500 and the lid plate when vacuum loaded may be further reduced. For example, the step 550 creates a larger gap between the surface of the choke plate 500 and the lid plate and thereby enables a greater degree of deflection of the choke plate 500 prior to the first surface 502 (and step 550) of the choke plate 500 contacting the lid plate.

Figure 7:
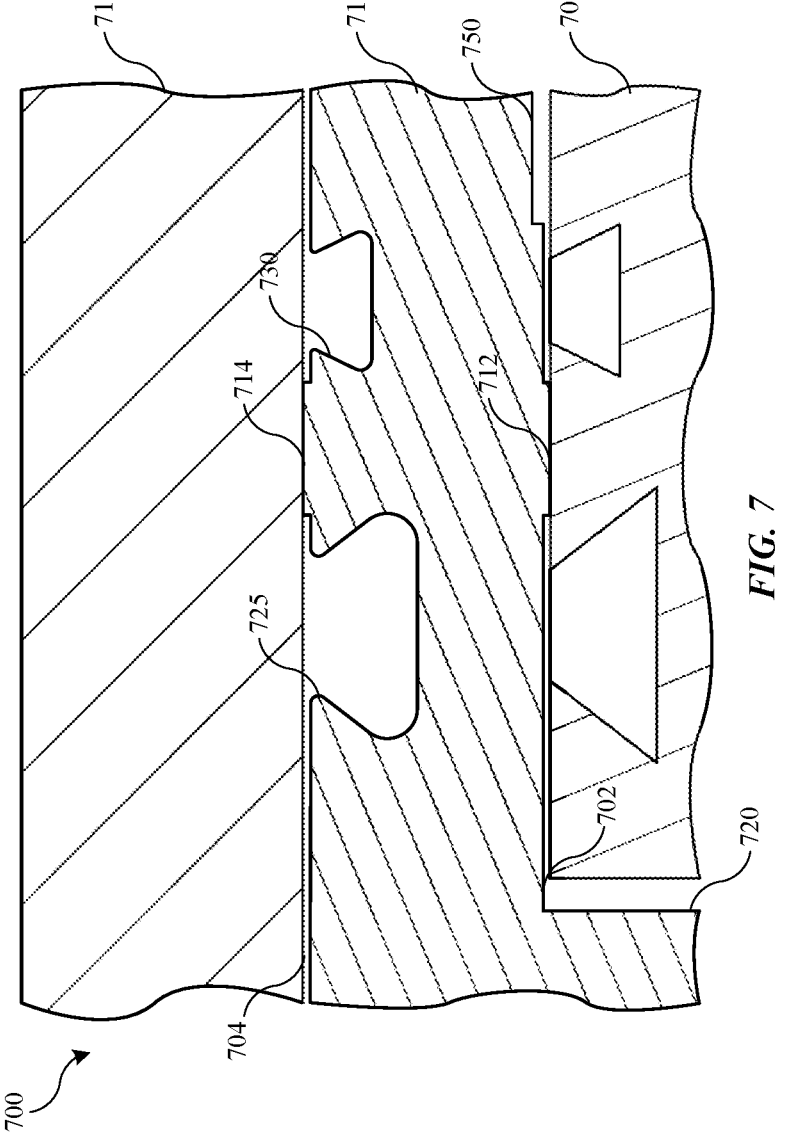
FIG. 7 shows a schematic cross-sectional view of a partial lid stack arrangement according to some embodiments of the present technology.

FIG. 7 shows a schematic cross-sectional view of a partial lid stack arrangement 700 according to some embodiments of the present technology, and may show coupling proximate a midpoint of the bottom lid, such as opposite a second aperture or exhaust aperture as previously described. The lid stack arrangement may be included with any other features, characteristics, or components as previously described. The figure may illustrate a coupling between a lid plate 705, a choke plate 710, and a pumping liner 715. Choke plate 710 may be understood to include any of the features of choke plate 500 described above. As illustrated, a first protrusion 712 may extend from a first surface 702 of the choke plate 710 and seat the choke plate 710 on the lid plate 705, and may otherwise maintain a gap between the components, including between a rim 720 of the choke plate 710 and the lid plate 705. First protrusion 712 may illustrate a cross-section of protrusion 515 described above. Choke plate 710 may include a step 750 (similar to step 550) that increases a distance between the first surface 702 and the lid plate 705 to help maintain a gap between the components when the cantilever portion of the choke plate 710 is loaded by additional lid stack components. A second protrusion 714 may extend from a second surface 704 of the choke plate 710 opposite the first surface 702, and allow the pumping liner 715 to be seated on the choke plate 710, while otherwise maintaining a gap between the components. Second protrusion 714 may illustrate a cross-section of a protrusion 520 described above.

The figure may also illustrate channels that may be formed in the components to accommodate o-rings or elastomeric elements for vacuum coupling of the components. For example, the choke plate 710 may define one or more channels in the second surface 702 of the choke plate 710 adjacent the pumping liner 715. As illustrated, the choke plate 710 may define a first channel 740 in the second surface 704 of the choke plate 710 radially inward of the protrusions extending about the choke plate 710, including protrusion 714. The first channel 725 may extend radially about the choke plate 710, and may be configured to seat an elastomeric element. The choke plate 710 may also define a second channel 745 in the second surface 704 of the choke plate 710 radially outward of the protrusions extending about the choke plate 710, including protrusion 714. The second channel 745 may extend radially about the choke plate 710, and may be configured to seat a component, such as an RF gasket for an RF return path. In some embodiments, the channels 740 and 745 may be disposed radially inward of the step 750 formed in the first surface 702 of the choke plate 710.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a plate" includes a plurality of such plates, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate processing system comprising:
a chamber body defining a transfer region;
a lid plate seated on the chamber body, wherein the lid plate defines a first plurality of apertures through the lid plate and a second plurality of apertures through the lid plate; and
a plurality of lid stacks equal to a number of apertures of the first plurality of apertures defined through the lid plate, wherein the plurality of lid stacks at least partially define a plurality of processing regions vertically offset from the transfer region, and wherein each lid stack of the plurality of lid stacks comprises:
a choke plate seated on the lid plate along a first surface of the choke plate, wherein:
the choke plate defines a first aperture axially aligned with an associated aperture of the first plurality of apertures, and wherein the choke plate defines a second aperture axially aligned with an associated aperture of the second plurality of apertures; and
the choke plate defines a first set of protrusions extending from a first surface of the choke plate, the first set of protrusions being arranged substantially symmetrically about the first aperture;
the choke plate is seated on the lid plate on the first set of protrusions;
the choke plate defines a second set of protrusions extending from a second surface of the choke plate, the second set of protrusions being arranged substantially symmetrically about the first aperture;
a pumping liner seated on the second set of protrusions of the choke plate; and
a faceplate seated on the pumping liner.

2. The substrate processing system of claim 1, wherein:
the choke plate comprises a rim defining the first aperture; and
the rim extends along a sidewall of the lid plate defining the associated aperture of the first plurality of apertures.

3. The substrate processing system of claim 1, wherein:
the associated aperture of the second plurality of apertures defined through the lid plate and the second aperture defined through the choke plate form a flow channel extending from the pumping liner.

4. The substrate processing system of claim 1, wherein:
the choke plate defines a first channel in the second surface of the choke plate radially inward of the second set of protrusions; and
the choke plate defines a second channel in the second surface of the choke plate radially outward of the second set of protrusions.

5. The substrate processing system of claim 1, further comprising:
a blocker plate seated on the faceplate.

6. The substrate processing system of claim 5, further comprising:
a faceplate heater seated on the faceplate and positioned radially outward of the blocker plate.

7. The substrate processing system of claim 5, further comprising:

a gasbox seated on the blocker plate.

8. The substrate processing system of claim 1, wherein:

the second aperture defined through the choke plate is laterally offset from the first aperture defined through the choke plate.

9. The substrate processing system of claim 1, wherein:

each protrusion of the second set of protrusions is vertically aligned with a protrusion of the first set of protrusions.

10. The substrate processing system of claim 1, wherein:

the first surface of the choke plate defines a step that is disposed radially outward from the first set of protrusions.

11. The substrate processing system of claim 10, wherein:

the step is recessed relative to the first surface by a distance of between about 0.05 mm and 0.50 mm.

12. The substrate processing system of claim 1, wherein:

an outer periphery of the choke plate is generally tear drop-shaped.

13. The substrate processing system of claim 1, wherein:

each protrusion of the first set of protrusions and the second set of protrusions has a width of between about 1 mm and 10 mm.

14. A substrate processing chamber choke plate, comprising:

a plate defining a first aperture through the plate and a second aperture through the plate, wherein:

the second aperture is laterally offset from the first aperture;

the plate defines a first set of protrusions extending from a first surface of the plate, the first set of protrusions being arranged substantially symmetrically about the first aperture; and the plate defines a second set of protrusions extending from a second surface of the plate opposite the first surface of the plate, the second set of protrusions being arranged substantially symmetrically about the first aperture.

15. The substrate processing chamber choke plate of claim 14, wherein:

the plate comprises a rim defining the first aperture, and wherein the rim extends vertically from the first surface of the plate.

16. The substrate processing chamber choke plate of claim 14, wherein:

the first set of protrusions are disposed at regular intervals about the first aperture; and the second set of protrusions are disposed at regular intervals about the first aperture.

17. The substrate processing chamber choke plate of claim 14, wherein:

each of the first set of protrusions and the second set of protrusions has a length of between about 5 mm and 50 mm.

18. The substrate processing chamber choke plate of claim 14, wherein:

the plate defines a third set of protrusions extending from the first surface of the plate, the third set of protrusions being arranged substantially symmetrically about the second aperture; and the plate defines a fourth set of protrusions extending from the second surface of the plate, the fourth set of protrusions being arranged substantially symmetrically about the second aperture.

19. A substrate processing system comprising:

a processing chamber defining a processing region;

a pedestal configured to support a substrate within the processing region;

a choke plate defining a first aperture and a second aperture through the choke plate, wherein:

the choke plate defines a first set of protrusions extending from a first surface of the choke plate, the first set of protrusions being arranged substantially symmetrically about the first aperture; and the choke plate defines a second set of protrusions extending from a second surface of the plate opposite the first surface of the choke plate, the second set of protrusions being arranged substantially symmetrically about the first aperture;

a pumping liner seated on the choke plate;

a faceplate seated on the pumping liner; and a blocker plate seated on the faceplate.

20. The substrate processing system of claim 19, wherein:

the first set of protrusions is vertically aligned with the second set of protrusions.

* * * * *